United States Patent
Yasuda et al.

(10) Patent No.: US 6,803,792 B2
(45) Date of Patent: Oct. 12, 2004

(54) INPUT BUFFER CIRCUIT WITH CONSTANT RESPONSE SPEED OF OUTPUT INVERSION

(75) Inventors: Kenichi Yasuda, Hyogo (JP); Hironori Iga, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/355,167

(22) Filed: Jan. 31, 2003

(65) Prior Publication Data

US 2004/0051559 A1 Mar. 18, 2004

(30) Foreign Application Priority Data

Sep. 12, 2002 (JP) ........................ 2002-266920

(51) Int. Cl.[7] ...................... H03K 19/00; H03K 5/153; H03K 5/22
(52) U.S. Cl. ........................ 326/93; 327/74
(58) Field of Search ................ 326/93, 64; 330/255; 341/155; 327/108, 114, 333; 365/189.05, 74, 72

(56) References Cited

U.S. PATENT DOCUMENTS

| | | | | |
|---|---|---|---|---|
| 5,079,439 A | * | 1/1992 | Wanlass | 327/333 |
| 5,103,114 A | * | 4/1992 | Fitch | 327/114 |
| 5,920,729 A | * | 7/1999 | Barnett | 326/64 |
| 6,163,216 A | * | 12/2000 | Murray et al. | 330/255 |
| 6,583,746 B2 | * | 6/2003 | Tokioka | 341/155 |
| 6,674,313 B2 | * | 1/2004 | Kurisu et al. | 327/108 |

FOREIGN PATENT DOCUMENTS

JP    P2000-306385 A    11/2000

* cited by examiner

Primary Examiner—Patrick Wambley
(74) Attorney, Agent, or Firm—McDermott Will & Emery LLP

(57) ABSTRACT

Two input buffer circuits of current mirror type input buffer circuits are combined, and output signals OUT1, OUT2 therefrom are combined to provide output signal OUT via inverter. By inputting complementary clock signals CK, /CK from opposing directions to each other, even complementary clock signals CK, /CK are anti-phase, output signals OUT 1 and OUT 2 are combined in-phase.

3 Claims, 8 Drawing Sheets

INPUT BUFFER CIRCUIT WITH CONSTANT RESPONSE SPEED OF OUTPUT INVERSION

BACKGROUND OF THE INVENTION

Field of the Invention

The present invention relates to an input buffer circuit, and more specifically, to an input buffer circuit of a semiconductor device inverting an output corresponding to a crossing point of complementary signals.

Description of the Background Art

The processing speed of a processing system such as a computer system or a communication system has been increasing recently, and the speed of Dynamic Random Access Memory (hereinafter referred to as DRAM) used as main memory in such processing system has been increasing as well. The Synchronous DRAM (hereinafter referred to as SDRAM) synchronizes, for example, with a clock signal that is a system clock, and receives an address signal and a control signal and performs data input/output. In SDRAM, it is not required to consider the margin for the skew of an external signal, and hence the internal operation can be performed at high speed.

Recently, the drastic improvement in operating speed of microprocessor (MPU) has been exceeding the improvement in operating speed of DRAM, and hence, in some cases access time and cycle time of DRAM may bottleneck the performance of overall system. Thus, in order to address high speed MPU, Double Data Rate SDRAM (hereinafter referred to as DDR SDRAM) has been proposed, which has double data rate as compared to SDRAM. In contrast to conventional SDRAM using only rising edge of a clock signal as a synchronizing signal, DDR SDRAM uses both of rising and falling edges of a clock signal as synchronizing signals. Further, it handles input/output signal of high frequency.

FIG. 8 is a circuit diagram showing the configuration of a conventional current mirror type input buffer circuit 100, as used for a semiconductor device such as DDR SDRAM.

As shown in FIG. 8, conventional current mirror type input buffer circuit 100 includes a P-channel MOS transistor 102 having gate drive voltage of input buffer circuit activation signal /EN and connected to power supply node 101 (voltage VDD), an N-channel MOS transistor 103 having gate drive voltage of input voltage DIN and having one end connected to ground node, an N-channel MOS transistor 104 having gate drive voltage of reference voltage VREF and having one end connected to ground node, a P-channel MOS transistor 105 connected between P-channel MOS transistor 102 and N-channel MOS transistor 104 and having gate drive voltage of the voltage of connection node N11 connecting to N-channel MOS transistor 104, a P-channel MOS transistor 106 connected between P-channel MOS transistor 102 and N-channel MOS transistor 103 and similarly having gate drive voltage of the voltage of connection node N11, and a buffer 110 connected to connection node N12 connecting P-channel MOS transistor 106 and N-channel MOS transistor 103.

P-channel MOS transistor 102 is rendered conductive when activation signal /EN is at L level to activate the input buffer circuit shown in FIG. 8, as well as to operate as a constant current source. Buffer 110 operates as a drive buffer that drives corresponding to the voltage of node N12.

Next, the operation of the current mirror type input buffer circuit will be described.

Here, it is assumed that proportion of W/L (W indicates channel width, and L indicates channel length) of P-channel MOS transistor 105 to W/L of N-channel MOS transistor 104 is the same with that of W/L of P-channel MOS transistor 106 to W/L of N-channel MOS transistor 103.

In this case, when input voltage DIN of the gate drive voltage of N-channel MOS transistor 103 is equal to reference voltage VREF of the gate drive voltage of N-channel MOS transistor 104, the voltage of node N12 will be ½ VDD. When input voltage DIN changes from reference voltage VREF, corresponding to that differential voltage, the voltage of node N12 changes from ½ VDD.

In other words, if input voltage DIN is higher than reference voltage VREF, then the voltage of node N12 will be lower than ½ VDD, and if input voltage DIN is lower than reference voltage VREF, then the voltage of node N12 will be higher than ½ VDD. Hence, by setting threshold value of buffer 110 to ½ VDD, reference voltage VREF will be the threshold voltage of input voltage DIN for the output of buffer 110.

Input buffer circuit 100 as described above and shown in FIG. 8 functions as a clock buffer circuit, which is one of the input buffer circuits, by inputting clock signal CK as reference voltage VREF, and clock signal /CK as input voltage DIN, respectively. This clock buffer circuit inverts the output corresponding to the crossing point of complementary clock signals CK, /CK.

FIG. 9 is a timing diagram related to the description of the operation of a semiconductor device such as DDR SDRAM.

Complementary clock signals CK, /CK are input to a clock buffer circuit such as described above referring to FIG. 8. The clock buffer circuit inverts the output corresponding to the crossing point of complementary clock signals CK, /CK. Command signal CMD generates READ command synchronizing to the output inversion. The semiconductor device internally performs a signal processing operation, and thereafter outputs data of data signal DQ to the outside of semiconductor device after time point t2. Thus, the semiconductor device such as DDR SDRAM initiates the internal operation synchronizing to the crossing point of complementary clock signals CK, /CK input to the clock buffer circuit.

Here, access time tAC is defined by the time difference from the crossing point of complementary clock signals CK, /CK to the time point data signal DQ crosses the level of reference voltage VREF (the signal level up to time point t2). For example, in FIG. 9, access time tAC is from time point t1 to t2, and from time points t3 to t4.

As for DDR 266, which is one product of DDR SDRAM, access time tAC is defined in the range of −750 ps≦tAC≦750 ps. In order to define access time tAC within this range, a delay process is performed inside DDR 266 to adjust the timing of the crossing point of complementary clock signals CK, /CK and data output of data signal DQ.

As in the foregoing, the semiconductor device such as DDR SDRAM initiates the internal operation synchronizing to the crossing point of complementary clock signals CK, /CK input to the clock buffer circuit, and access time tAC is affected by the initiation time of the internal operation. Complementary clock signals CK, /CK are assumed to cross with each other at the level of reference voltage VREF.

Complementary clock signals CK, /CK, however, do not always cross with each other at the level of reference voltage VREF, actually.

FIG. 10 is a timing diagram enlarging a portion where complementary clock signals CK, /CK cross with each other at the potential other than the level of reference voltage VREF.

As shown in FIG. 10, when complementary clock signals CK, /CK cross with each other at the potential other than the level of reference voltage VREF and if the clock buffer circuit is a current mirror type input buffer circuit, then response speed of output inversion changes corresponding to the potential level where clock signals cross with each other. As the speed of output inversion of the clock buffer circuit changes, the initiation time of the internal operation of the semiconductor device such as DDR SDRAM changes.

Since access time tAC is affected by the initiation time of the internal operation, when complementary clock signals CK, /CK cross with each other at the potential other than the level of reference voltage VREF, the value of access time tAC changes, as a result. In other words, if the clock buffer circuit is a current mirror type input buffer circuit, then access time tAC undesirably changes depending on the potential level at which complementary clock signals CK, /CK cross with each other.

SUMMARY OF THE INVENTION

The object of the present invention is to provide an input buffer circuit having constant response speed of output inversion irrespective of potential level at which complementary signals cross with each other.

The present invention is directed to an input buffer circuit inverting an output corresponding to a crossing point of complementary signals, which includes a first input buffer unit, a second input buffer unit, and a signal processing unit. The first input buffer unit includes a current mirror circuit and first and second transistors connected the current mirror circuit, and compares a voltage of an input signal input to gate terminal of the first transistor and a reference voltage input to gate terminal of the second transistor, and depending on the comparison result, provides a first output signal. The second input buffer unit includes identical circuit configuration to the first input buffer unit, and compares a voltage of the reference voltage input to gate terminal of a third transistor corresponding to the first transistor and a voltage of a signal, which is complementary to the input signal, input to gate terminal of a fourth transistor corresponding to the second transistor, and depending on the comparison result, provides a second output signal. The signal processing unit combines and buffers the first and second output signals and determines the logic of the input signal.

Therefore, according to the present invention, by combining two input buffer circuits and inputting complementary signals from opposing directions to each other, constant response speed of output inversion is attained, irrespective of potential level at which complementary signals cross with each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
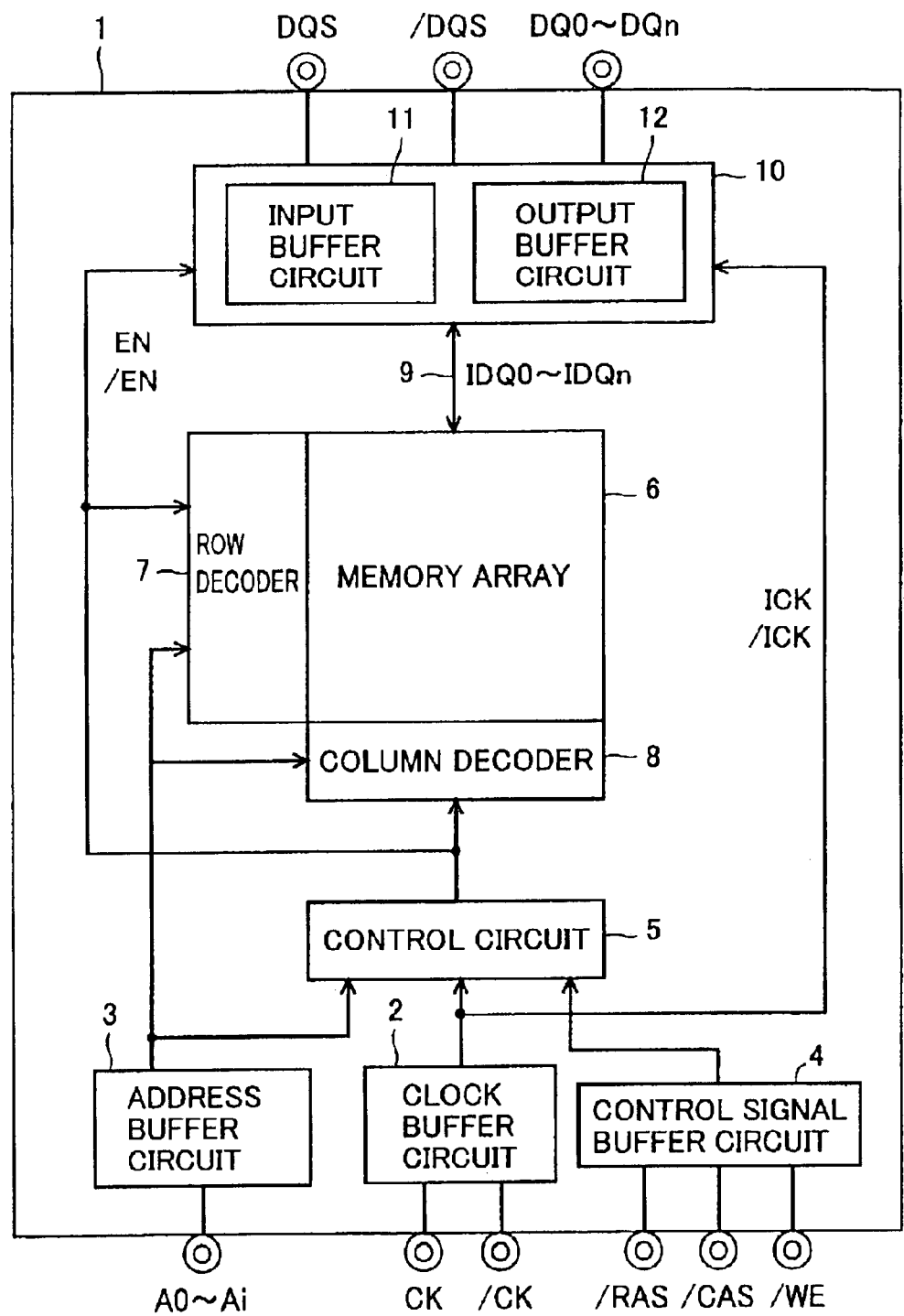
FIG. 1 is a schematic block diagram showing the schematic configuration of semiconductor device 1 including an input buffer circuit of the present invention.

In the following, referring to the figures, embodiments of the present invention will be described in detail. Similar or identical parts are given an identical reference character, and the description thereof will not be repeated.

As shown in FIG. 1, a semiconductor device 1 including an input buffer circuit of the present invention includes a clock buffer circuit 2 receiving complementary signals CK, /CK from the outside, an address buffer circuit 3 receiving address signals A0-Ai, and a control signal buffer circuit 4 receiving control signals including row address strobe signal /RAS, column address strobe signal /CAS, and write enable signal /WE.

Clock buffer circuit 2 latches complementary signals CK, /CK receiving from the outside and outputs a clock signal. Clock buffer circuit 2 will be described in detail later.

Address buffer circuit 3 latches address signals A0-Ai receiving from the outside and outputs an address signal synchronizing to clock signals CK, /CK.

Control signal buffer circuit 4 latches row address strobe signal /RAS, column address strobe signal /CAS and write enable signal /WE receiving from the outside, and outputs the control signal above synchronizing to clock signal CK, /CK.

Semiconductor device 1 further includes a control circuit 5, a memory array 6, a row decoder 7, a column decoder 8, a bit line pair 9, and an input/output buffer circuit 10.

Clock circuit 5 synchronizes to clock signals CK, /CK output from clock buffer circuit 2 and receives address signals A0-Ai output from address buffer circuit 3 and row address strobe signal /RAS, column address strobe signal /CAS and write enable signal /WE output from control signal buffer circuit 4. Control circuit 5 determines whether each address signal A0-Ai taken by address buffer circuit 3 is a row address signal or a column address signal, depending on the combination of logic level of the control signal received from control signal buffer circuit 4. When address signal A0-Ai is a column address signal, control circuit 5 outputs to row decoder 7 a signal that activates row decoder 7.

When activated by the activation signal received from control circuit 5, row decoder 7 takes address signal A0-Ai from address buffer circuit 3, and activates a word line on memory array 6 corresponding to that address signal A0-Ai.

When address signal A0-Ai is a column address signal, control circuit 5 outputs to column decoder 8 a signal that activates column decoder 8.

When activated by the activation signal received from control circuit 5, column decoder 8 takes address signal A0-Ai from address buffer circuit 3, and activates a bit line pair 9 on memory array 6 corresponding to that address signal A0-Ai.

Thus, a memory cell on memory array 6 corresponding to address signal A0-Ai is activated.

A plurality of bit line pairs 9 provided on memory array 6 are connected to a plurality of memory cells on memory array 6 and perform data input/output.

Input/output circuit 10 includes an input buffer circuit 11 and an output buffer circuit 12.

Input buffer circuit 11 receives data DQ0-DQn as well as complementary data strobe signal DQS, /DQS, which is to be a reference for read timing of data DQ0-DQn, from the outside. Input buffer circuit 11 outputs internal data IDQ0-IDQn to bit line pair 9 via a sense amplifier (not shown).

Output buffer circuit 12 receives internal data IDQ0-IDQn from bit line pair 9 via the sense amplifier (not shown), and outputs complementary data strobe signals DQS, /DQS, which are to be references for read timing of data DQ0-DQn.

Next, the configuration of clock buffer circuit 2 as one example of an input buffer circuit of the present invention will be described. Though a clock buffer circuit will be described herein as an example of the input buffer circuit of the present invention, the input buffer circuit of the present invention is not limited to the clock buffer circuit. As for semiconductor device 1 above, for example, address buffer circuit 3, control signal buffer circuit 4, and input buffer circuit 11 may also be functioned as the input buffer circuit of the present invention.

First Embodiment

Figure 2:
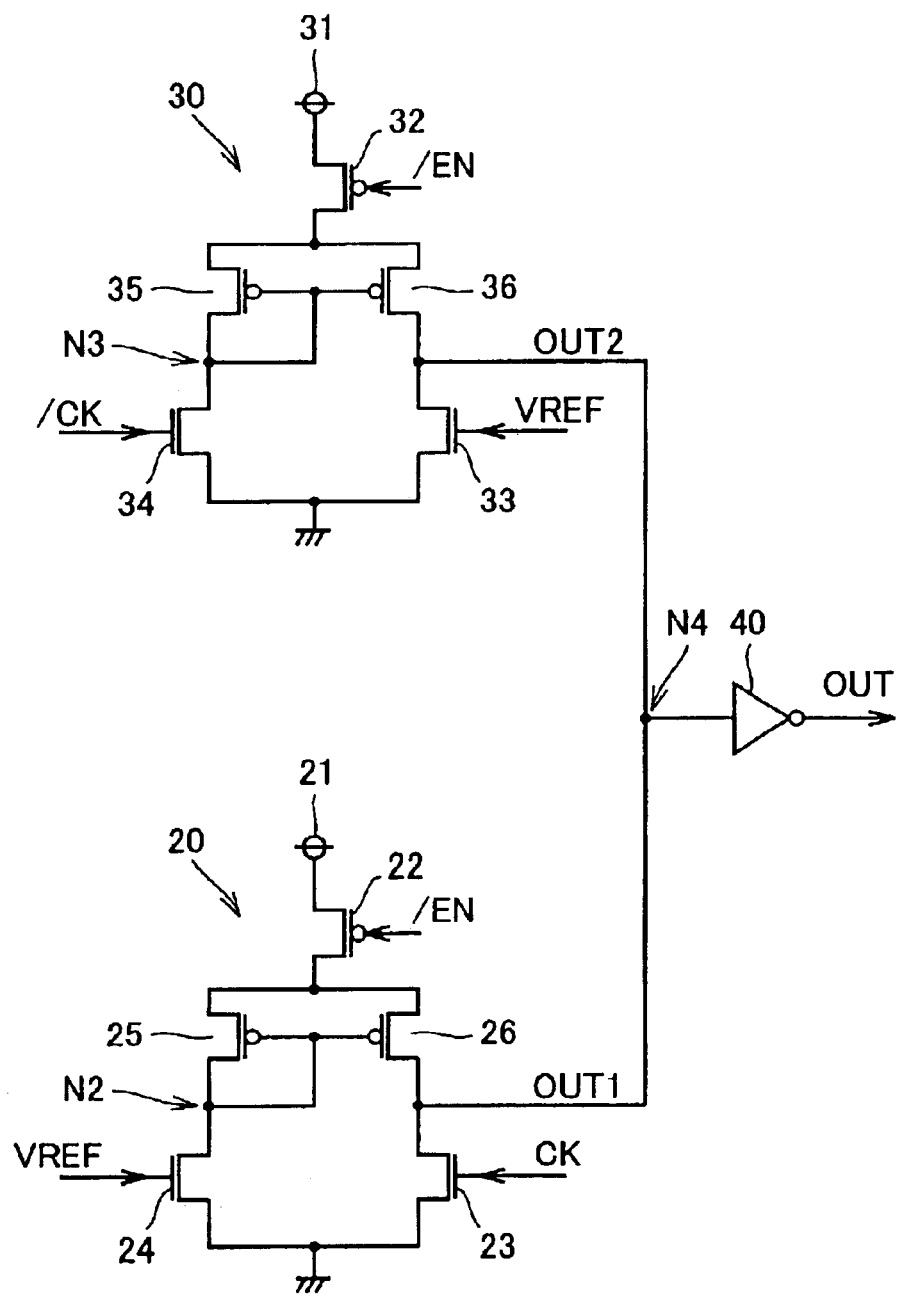
FIG. 2 is a circuit diagram showing the configuration of clock buffer circuit 2A as one example of input buffer circuit according to a first embodiment of the present invention.

As shown in FIG. 2, a clock buffer circuit 2A, as an example of the input buffer circuit according to a first embodiment of the present invention, is configured as follows: combining two input buffer circuits 20, 30 of conventional current mirror type input buffer circuits as described referring to FIG. 8, and output signals OUT1, OUT2 therefrom are combined at node N4 to provide output signal OUT via inverter 40.

Input buffer circuit 20 includes a P-channel MOS transistor 22 having gate drive voltage of input buffer circuit activation signal /EN and connected to power supply node 21 (voltage VDD), an N-channel MOS transistor 23 having gate drive voltage of clock signal CK and having one end connected to ground node, an N-channel MOS transistor 24 having gate drive voltage of reference voltage VREF and having one end connected to ground node, a P-channel MOS transistor 25 connected between P-channel MOS transistor 22 and N-channel MOS transistor 24 and having gate drive voltage of the voltage of connection node N2 connecting to N-channel MOS transistor 24, and a P-channel MOS transistor 26 connected between P-channel MOS transistor 22 and N-channel MOS transistor 23 and similarly having gate drive voltage of the voltage of node N2.

Input buffer circuit 30 includes a P-channel MOS transistor 32 having gate drive voltage of input buffer circuit activation signal /EN and connected to power supply node 31 (voltage VDD), an N-channel MOS transistor 33 having gate drive voltage of reference voltage VREF and having one end connected to ground node, an N-channel MOS transistor 34 having gate drive voltage of clock signal /CK and having one end connected to ground node, a P-channel MOS transistor 35 connected between P-channel MOS transistor 32 and N-channel MOS transistor 34 and having gate drive voltage of the voltage of connection node N3 connecting to N-channel MOS transistor 34, and P-channel MOS transistor 36 connected between P-channel MOS transistor 32 and N-channel MOS transistor 33 and similarly having gate drive voltage of the voltage of node N3.

As above, by inputting complementary clock signals CK, /CK from opposing directions to each other, even complementary clock signals CK, /CK are anti-phase, output signals OUT 1 and OUT 2 are combined in-phase.

When respective output timing of output signals OUT 1 and OUT 2 are close, the potential level of output signal OUT, resulted from waveform synthesis of the both signals and output from inverter 40, will be an intermediate value between output signals OUT 1 and OUT 2. Generally, in a semiconductor device such as DDR SDRAM, reference voltage is defined in the range of $0.49\ \text{VDD} \leq \text{VREF} \leq 0.51\ \text{VDD}$. In other words, reference voltage VREF is set approximately at the intermediate potential between H level and L level.

Figure 3:
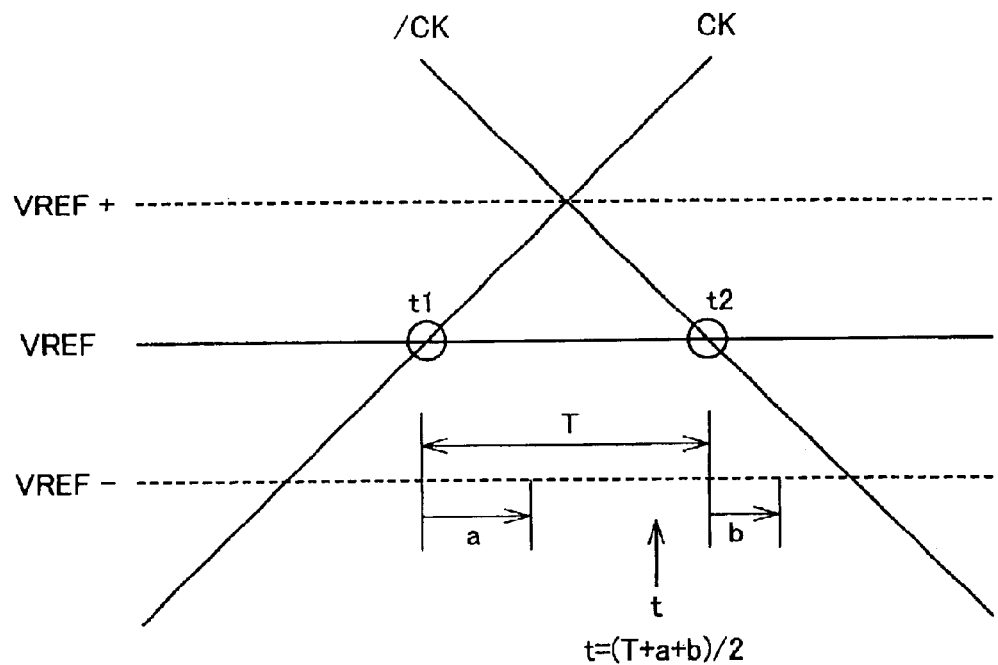
FIG. 3 is a timing diagram enlarging a portion where complementary clock signals CK, /CK cross with each other at potential VREF+ higher than reference voltage VREF.

FIG. 3 is a timing diagram showing enlarged part where complementary clock signals CK, /CK cross with each other at the potential VREF+ higher than reference voltage VREF.

In FIG. 3, the time points at which clock signals CK, /CK cross the reference potential VREF are t1 and t2, respectively. Here, if a time period between time points t1 and t2 is T, a time period required to invert output signal OUT 1 is a, and time period required to invert output signal OUT 2 is b, then output inversion timing t of output signal OUT resulted from waveform synthesis of output signals OUT 1 and OUT 2 will be expressed as follows: $t=(T+a+b)/2$.

Figure 4:
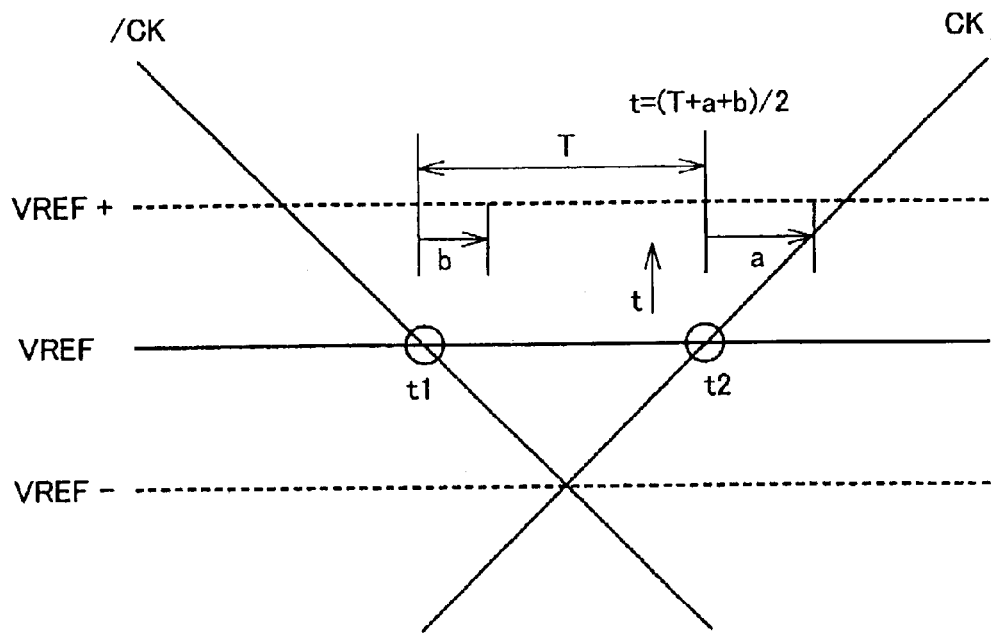
FIG. 4 is a timing diagram enlarging a portion where complementary clock signals CK, /CK cross with each other at potential VREF− lower than reference voltage VREF.

FIG. 4 is a timing diagram showing enlarged part where complementary clock signals CK, /CK cross with each other at the potential VREF− lower than reference voltage VREF.

In FIG. 4, the time points at which clock signals /CK, CK respectively cross the reference potential VREF are t1 and t2. Here, if a time period between time points t1 and t2 is T, a time period required to invert output signal OUT 1 is a, and time period required to invert output signal OUT 2 is b, then output inversion timing t of output signal OUT resulted from waveform synthesis of output signals OUT 1 and OUT 2 will again be expressed as follows: $t=(T+a+b)/2$.

Thus, by combining two current mirror type input buffer circuits and inputting complementary clock signals from opposing directions to each other, clock buffer circuit 2A attains constant response speed of output inversion irrespective of potential level at which complementary signals cross with each other.

Figure 5:
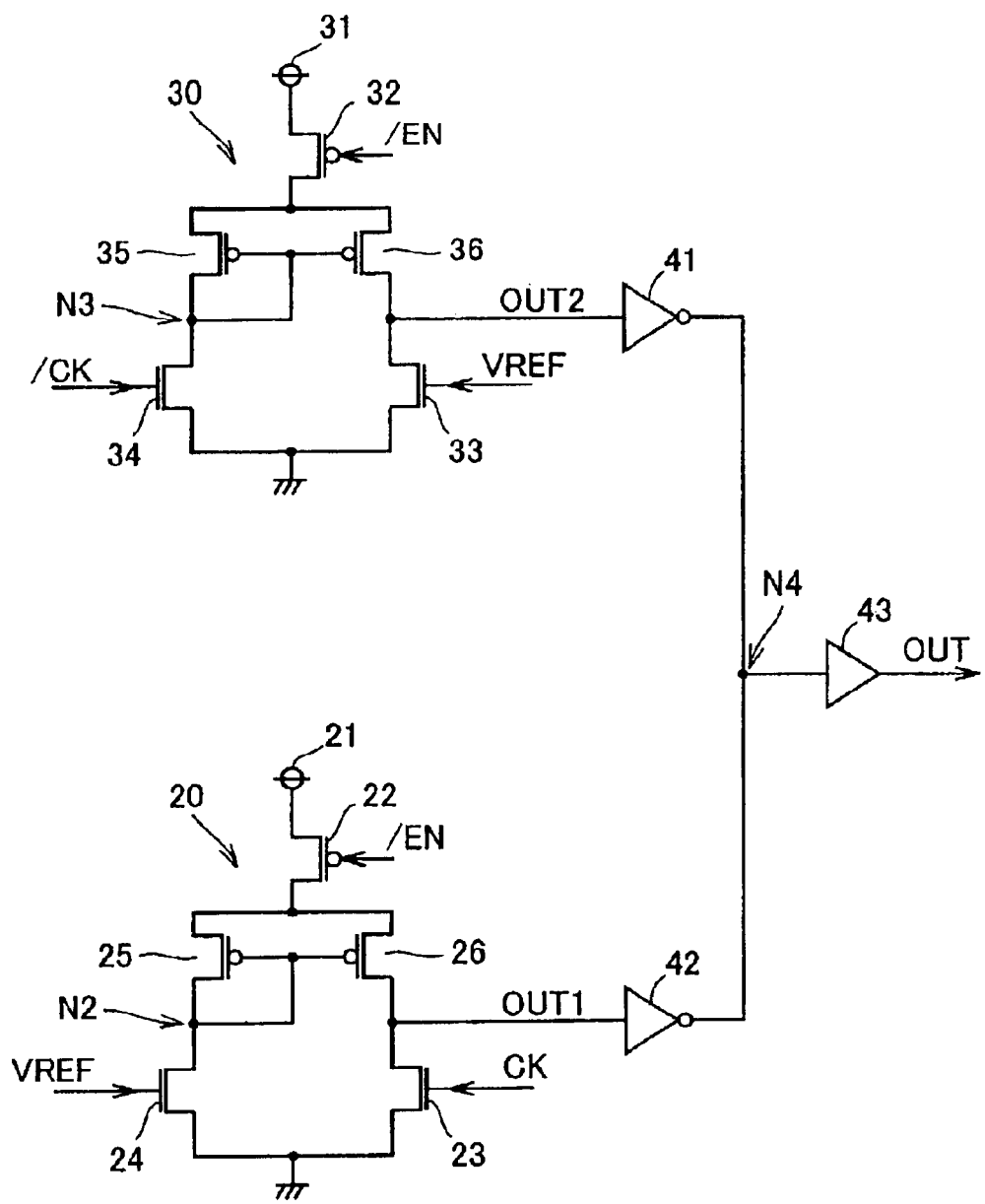
FIG. 5 is a circuit diagram showing the configuration of clock buffer circuit 2B as another example of the input buffer circuit according to the first embodiment of the present invention.
Figure 8:
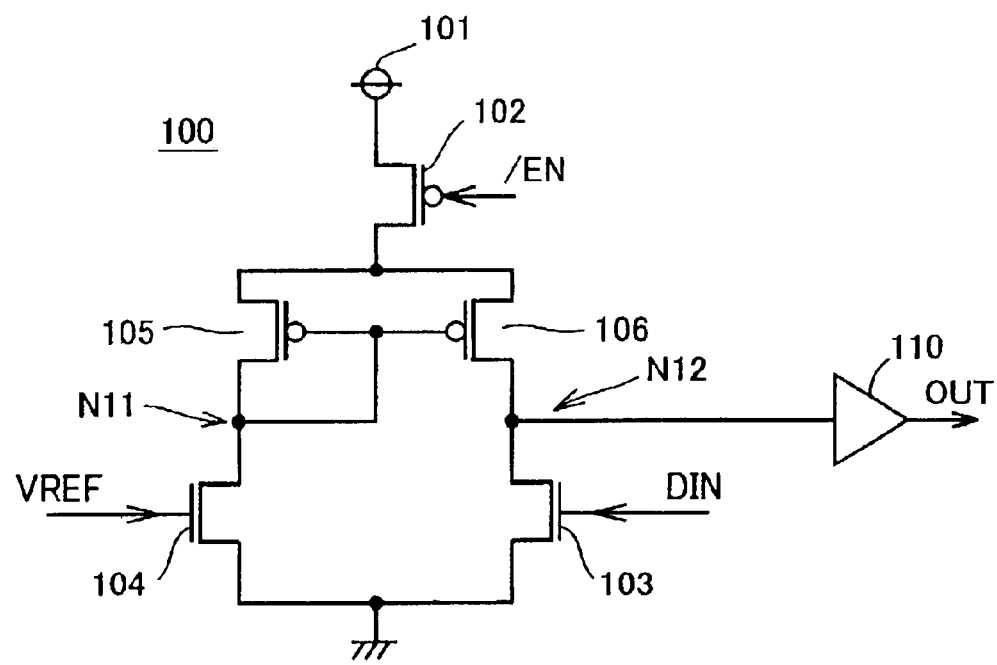
FIG. 8 is a circuit diagram showing the configuration of a conventional current mirror type input buffer circuit 100 used for a semiconductor device such as DDR SDRAM.
Figure 9:
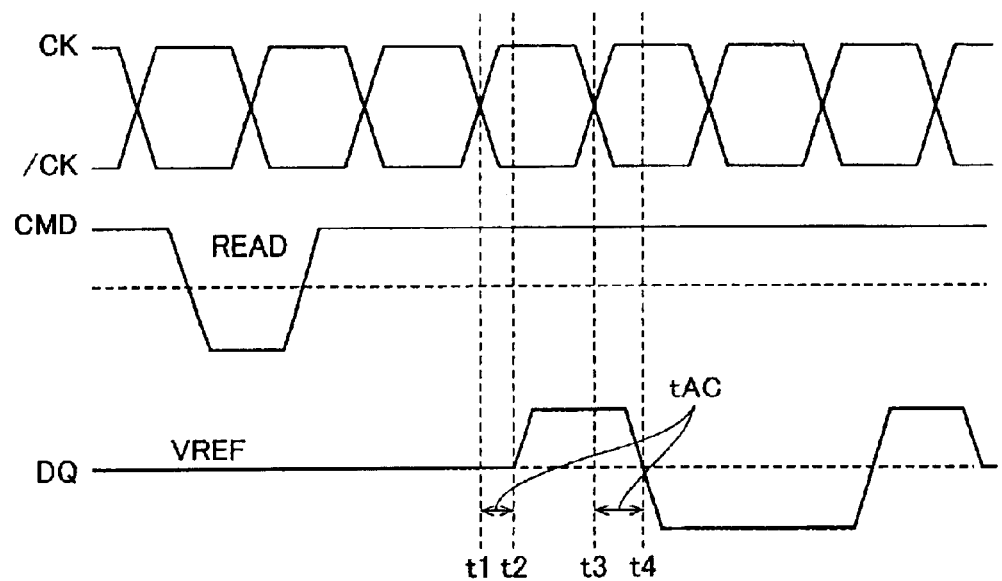
FIG. 9 is a timing diagram related to the description of the operation of a semiconductor device such as DDR SDRAM.
Figure 10:
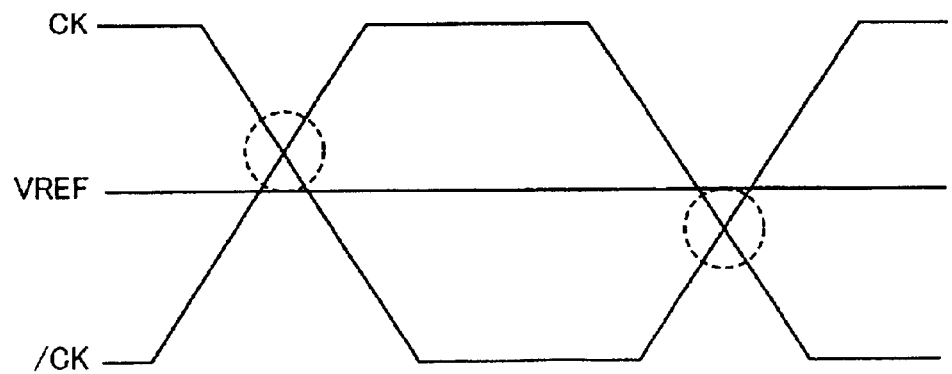
FIG. 10 is a timing diagram enlarging a portion where complementary clock signals CK, /CK cross with each other at a potential other than the level of reference voltage VREF.

As shown in FIG. 5, a clock buffer circuit 2B, as another example of the input buffer circuit according to the first embodiment of the present invention, is configured as follows: two input buffer circuits 20, 30, which are conventional current mirror type input buffer circuits as described referring to FIG. 8, are combined, and output signals OUT1, OUT2 therefrom are received at inverters 41, 42, respectively and thereafter subjected to waveform synthesis at node N4 to provide output signal OUT via buffer 43.

The operating characteristics of clock buffer circuit 2B are similar to that of clock buffer circuit 2A, therefore the description thereof using a timing diagram similar to FIGS. 3 and 4 for clock buffer circuit 2A will not be repeated.

Thus, by combining two current mirror type input buffer circuits and inputting complementary clock signals from opposing directions to each other similarly in clock buffer circuit 2A, clock buffer circuit 2B attains constant response speed of output inversion irrespective of potential level at which complementary signals cross with each other.

Second Embodiment

Figure 6:
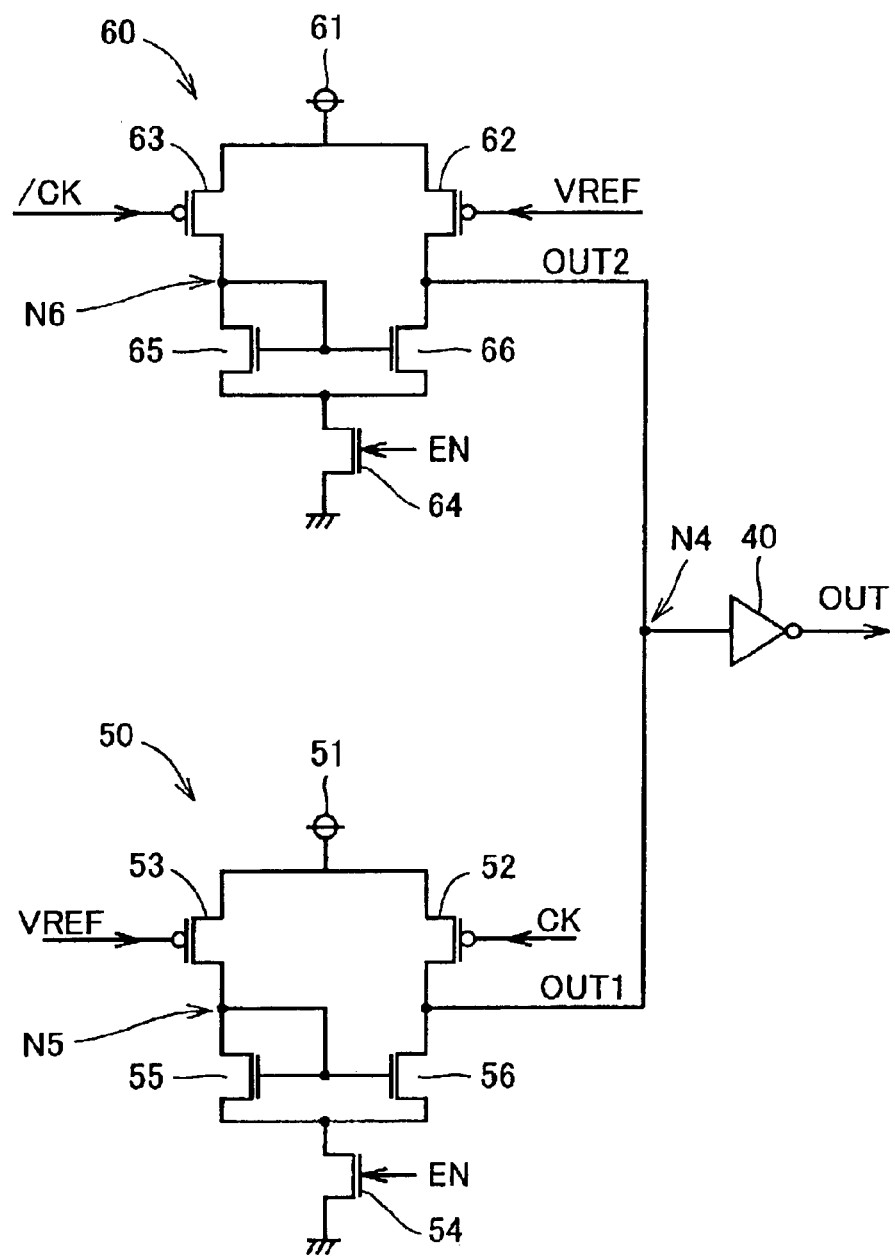
FIG. 6 is a circuit diagram showing the configuration of clock buffer circuit 2C as an example of an input buffer circuit according to a second embodiment of the present invention.

As shown in FIG. 6, a clock buffer circuit 2C as an example of an input buffer circuit according to a second embodiment of the present invention is configured as follows: combining two input buffer circuits 50, 60 of current mirror type input buffer circuits, which have configurations different from that of conventional current mirror type input buffer circuit as described referring to FIG. 8, and output signals OUT1, OUT2 therefrom are both subjected to waveform synthesis at node N4 to provide output signal OUT via inverter 40. While in the clock buffer circuit according to the first embodiment an N-channel MOS transistor is arranged at the input, in the clock buffer circuit according to the second embodiment a P-channel MOS transistor is arranged at the input.

Input buffer circuit 50 includes a P-channel MOS transistor 52 having gate drive voltage of clock signal CK and having one end connected to power supply node 51 (voltage VDD), a P-channel MOS transistor 53 having gate drive voltage of reference voltage VREF and having one end similarly connected to power supply node 51, an N-channel MOS transistor 54 having gate drive voltage of input buffer circuit activation signal EN and having one end connected to ground node, an N-channel MOS transistor 55 connected between P-channel MOS transistor 53 and N-channel MOS transistor 54 and having gate drive voltage of the voltage of connection node N5 connecting to P-channel MOS transistor 53, and an N-channel MOS transistor 56 connected between P-channel MOS transistor 52 and N-channel MOS transistor 54 and similarly having gate drive voltage of the voltage of node N5.

Input buffer circuit 60 includes a P-channel MOS transistor 62 having gate drive voltage of reference voltage VREF and having one end connected to power supply node 61 (voltage VDD), a P-channel MOS transistor 63 having gate drive voltage of clock signal /CK and having one end similarly connected to power supply node 61, an N-channel MOS transistor 64 having gate drive voltage of input buffer circuit activation signal EN and having one end connected to ground node, an N-channel MOS transistor 65 connected between P-channel MOS transistor 63 and N-channel MOS transistor 64 and having gate drive voltage of the voltage of connection node N6 connecting to P-channel MOS transistor 63, and an N-channel MOS transistor 66 connected between P-channel MOS transistor 62 and N-channel MOS transistor 64 and similarly having gate drive voltage of the voltage of node N6.

N-channel MOS transistors 54, 64 are rendered conductive when input buffer circuit activation signal EN is at H level.

The operating characteristics of clock buffer circuit 2C are similar to that of clock buffer circuit 2A according to the first embodiment, therefore the description thereof using a timing diagram similar to FIGS. 3 and 4 for clock buffer circuit 2A will not be repeated.

Thus, by combining two current mirror type input buffer circuits that have configurations different from that of clock buffer circuit 2A according to the first embodiment, and inputting complementary clock signals from opposing directions to each other, clock buffer circuit 2C attains constant response speed of output inversion irrespective of potential level at which complementary signals cross with each other.

Figure 7:
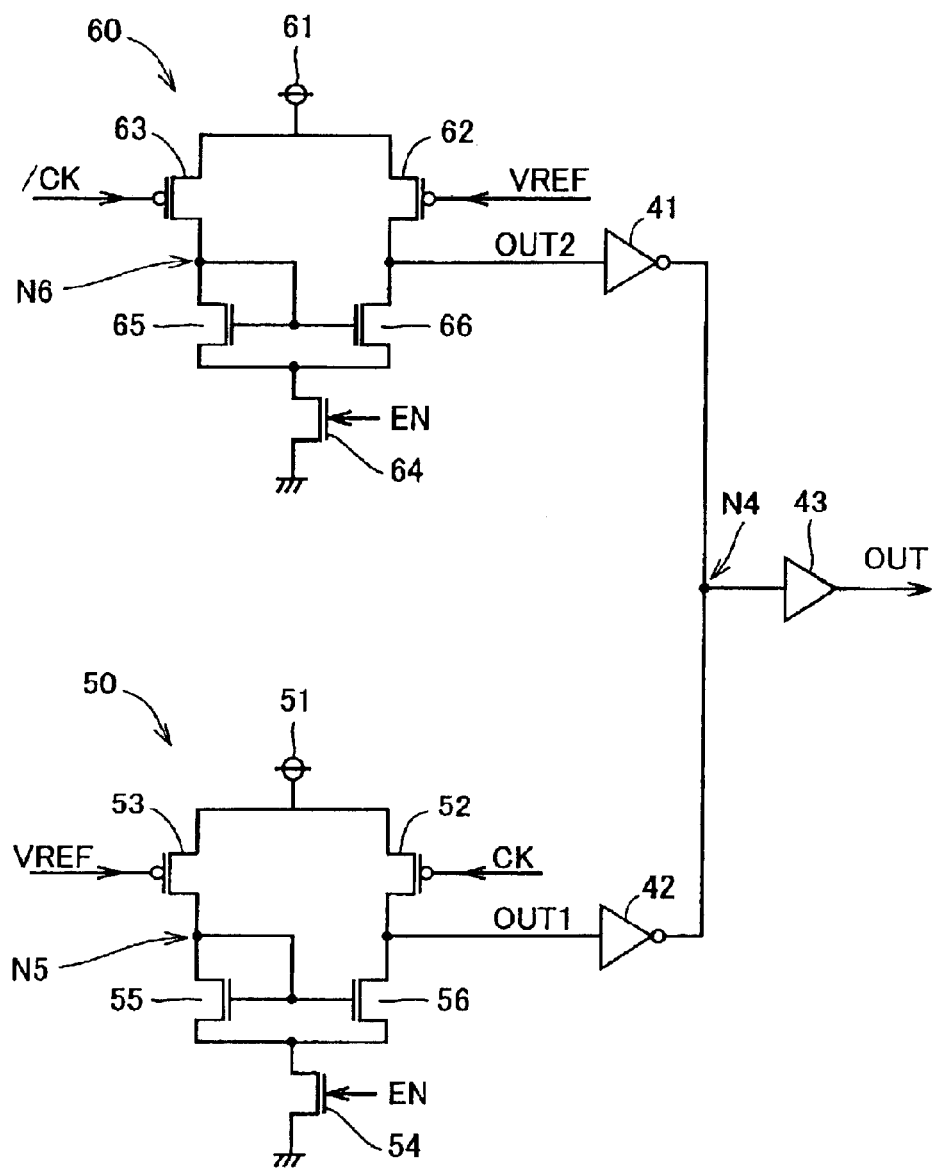
FIG. 7 is a circuit diagram showing the configuration of clock buffer circuit 2D as another example of the input buffer circuit according to the second embodiment of the present invention.

As shown in FIG. 7, a clock buffer circuit 2D, as another example of the input buffer circuit according to the second embodiment of the present invention, is configured as follows: two input buffer circuits 50, 60, which are conventional current mirror type input buffer circuits as described referring to FIG. 8, are combined, and output signals OUT1, OUT2 therefrom are received at inverters 41, 42, respectively, and thereafter subjected to waveform synthesis at node N4 to provide output signal OUT via buffer 43.

The operating characteristics of clock buffer circuit 2D are similar to that of clock buffer circuit 2A according to the first embodiment, therefore the description thereof using a timing diagram similar to FIGS. 3 and 4 for clock buffer circuit 2A will not be repeated.

Thus, by combining two current mirror type input buffer circuits and inputting complementary clock signals from opposing directions to each other similarly in clock buffer circuit 2C, clock buffer circuit 2D attains constant response speed of output inversion irrespective of potential level at which complementary signals cross with each other.

The input buffer circuit according to the present invention, including clock buffer circuits 2A, 2B, 2C, and 2D, is applicable when reference voltage VREF is applied from the outside of the semiconductor device, as well as when reference voltage VREF is generated in the semiconductor device for use.

By generating reference voltage VREF in the semiconductor device for use, even when reference voltage VREF is not supplied from the outside of the semiconductor device, the input buffer circuit according to the present invention can be operated. Further, even when reference voltage VREF is supplied from the outside of the semiconductor device, by generating reference voltage VREF in the semiconductor device, it becomes possible to avoid the effect of noises to the external reference voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input buffer circuit inverting an output corresponding to a crossing point of complementary signals, comprising:

a first input buffer unit, including a current mirror circuit and first and second transistors connected to said current mirror circuit, comparing a voltage of an input signal input to gate terminal of said first transistor and a reference voltage input to gate terminal of said second transistor, and outputting a first output signal depending on comparison result;

a second input buffer unit, having an identical circuit configuration to said first input buffer unit, comparing a voltage of said reference voltage input to gate terminal of a third transistor corresponding to said first transistor and a voltage of a signal, complementary to said input signal, input to gate terminal of a fourth transistor corresponding to said second transistor, and outputting a second output signal depending on comparison result; and a signal processing unit combining and buffering said first and second output signals and determining logic of said input signal.

2. The input buffer circuit according to claim 1, wherein said signal processing unit includes an inverter element combining and buffering said first and second output signals.

3. The input buffer circuit according to claim 1, wherein said signal processing unit further includes;

a first inverter element buffering said first output signal, a second inverter element buffering said second output signal, and a buffer element combining output signals output from said first and second inverter elements, respectively.

* * * * *